United States Patent [19]

Hashimoto et al.

[11] Patent Number: 5,347,134
[45] Date of Patent: Sep. 13, 1994

[54] APPARATUS FOR REPAIRING DEFECTS IN EMULSION MASKS BY PASSING LASER LIGHT THROUGH A VARIABLE SHAPED APERTURE

[75] Inventors: Hiroyuki Hashimoto; Kazuo Watanabe, both of Tokyo, Japan

[73] Assignee: Dai Nippon Insatsu Kabushiki Kaisha, Japan

[21] Appl. No.: 957,897

[22] Filed: Oct. 8, 1992

Related U.S. Application Data

[62] Division of Ser. No. 530,276, May 30, 1990, abandoned.

[30] Foreign Application Priority Data

| Jun. 6, 1989 | [JP] | Japan | 1-143248 |
| Jun. 12, 1989 | [JP] | Japan | 1-149253 |
| Sep. 14, 1989 | [JP] | Japan | 1-238872 |
| Sep. 14, 1989 | [JP] | Japan | 1-238873 |

[51] Int. Cl.⁵ ............................................. H01L 21/64
[52] U.S. Cl. ............................... 250/492.1; 250/492.22
[58] Field of Search ....................... 250/492.1, 492.22; 430/5, 945; 378/35; 427/554, 553, 558

[56] References Cited

U.S. PATENT DOCUMENTS

| 4,310,743 | 1/1982 | Seliger | 219/121.12 |
| 4,450,358 | 5/1984 | Reynolds | 250/492.1 |
| 4,463,073 | 7/1984 | Miyauchi et al. | 430/945 |
| 4,609,566 | 9/1986 | Hongo et al. | 430/945 |
| 4,900,581 | 2/1990 | Stuke et al. | 427/554 |

Primary Examiner—Jack I. Berman
Assistant Examiner—James Beyer
Attorney, Agent, or Firm—Wegner, Cantor, Mueller & Player

[57] ABSTRACT

Defective portions, such as black dot defects, in an emulsion layer of an emulsion mask such as a photomask are repaired or removed by irradiating an ultraviolet laser beam from a laser oscillator, preferably an excimer laser. The laser beam is passed through an adjustable aperture for shaping and is then projected onto defective portions in dimensional alignment, whereby the defective portions are destroyed. In order to ensure that only the defective portions are destroyed, the image of the aperture projected on the emulsion layer is observed so as not to cover the emulsion mask where defective portions do not exist. Defective portions such as white defects can also be repaired by using additional procedure together with the irradiation of the laser beam.

19 Claims, 13 Drawing Sheets

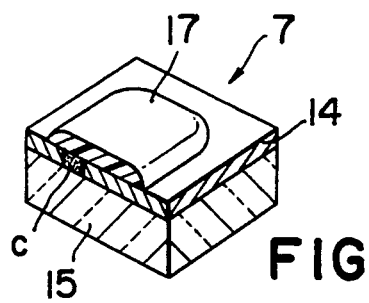
FIG. 9A
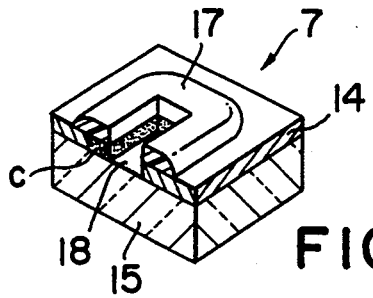
FIG. 9B
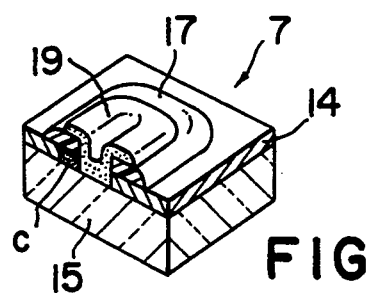
FIG. 9C
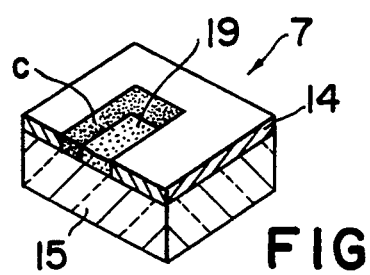
FIG. 9D
| STEP 1 | APPLICATION OF WEAKLY ADHESIVE RESIN |
| STEP 2 | LASER BEAM IRRADIATION TO DEFECT PORTION |
| STEP 3 | APPLICATION OF LIGHT INTERCEPTING PIGMENT |
| STEP 4 | REMOVAL OF WEAKLY ADHESIVE RESIN |
FIG. 8
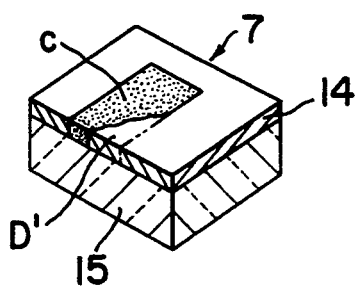
FIG. 10

APPARATUS FOR REPAIRING DEFECTS IN EMULSION MASKS BY PASSING LASER LIGHT THROUGH A VARIABLE SHAPED APERTURE

This application is a continuation of Ser. No. 07/530,276, filed May 30, 1990 now abandoned.

BACKGROUND OF THE INVENTION

The present invention relates to a method and an apparatus for repairing defects in emulsion masks and the like, and, in particular, to an apparatus and a method for removing defective portions existing in emulsion masks which are a type of photomasks used in the lithographic processes that is one of the processes for the manufacture of photoelectroformed products and photoetched products used for manufacturing semiconductors and the like, and for removing defective portions existing in patterns of organic layers (hereinafter also called emulsion masks) of color filters for LCD and CCD.

In recent years, increasingly fine patterns are required in connection with higher levels of integration of IC and LSI, and the patterns of semiconductor elements have tended to have higher levels of accuracy and quality. Apart from semiconductor elements, high accuracy and high quality are also required in the case of, for example, photoetched products such as shadow masks for color televisions, print circuit boards, electrodes for various types of display tubes and the lines of optical measuring apparatus, and in the case of photoelectroformed products such as meshes for camera tubes, electron microscope meshes, and other meshes for filtering. The recent photofabrication technology has enabled the achievement of degrees of fineness and accuracy that were not possible with the conventional mechanical process method, and a high accuracy of pattern is required for the photomasks used in the photofabrication technology.

In such photomasks that require a high pattern accuracy, it is necessary to repair small defects that occur in the mask manufacturing process.

Currently, photomasks are classified by their materials, into two types of emulsion masks and hard masks. Emulsion masks have a high-resolution photographic emulsion coated to the surface of a glass substrate.

Ordinary emulsion layer of the emulsion masks can be of either a silver emulsion or a non-silver emulsion, and the thickness of the layer is usually from 2 to 6 μm. Hard masks have a light intercepting metal film such as that of chrome, ferric oxide or tantalum, for example, deposited onto the surface of a glass substrate using either the vapor deposition or spattering method to form a film with a thickness of approximately 0.1 μm.

The defects that can occur in the photomask manufacturing method are black defects such as black dots and the like, and white defects such as pinholes and loss, etc. The method of correcting black dots and pinholes differ according to the type of photomask.

In the case of hard masks, the specific method that is generally used to repair black dot defects such as a black spot or a protruding portion is to apply to the area other than the defects a photoresist or mask of a material that does not corrode the metal layer and to then remove the defects by etching. In the case where fine black dot defects of the order of 1 μm have to be removed, then a positive resist such as the OFPR resist (product of Tokyo Oka Kabushiki Kaisha) is applied and then the light from a mercury lamp is focussed with a size of approximately 1 μm onto the resist on the defect to expose the resist. The exposed resist is then removed by developing processing and then an etching liquid is used to remove the light intercept metal film.

In the case of emulsion masks, the method of repairing defects is different because the emulsion layer is thick and there is no corrosive liquid such as used in the case of metals. For example, one of the methods for repairing black dot defects is to cut out the defect using the sharp end portion of a cutter knife or the like but the application of this method is limited to those instances where accuracy is not required or where those portions having defects are not connected to or adjacent to those portions that do not have defects. This method is not suitable for repairing the photomasks used for semiconductor manufacture or for fine processing. A repairing method using a YAG laser has been proposed in order to eliminate this deficiency. (Japanese Patent Laid Open Publication No. 60-207335)

In the case of a hard mask, white defects such as a pinhole or missing portion are removed by a method that involves applying a photoresist to the entire surface of the mask, exposing the portion of the photoresist on the fault and then developing the photoresist so that only that portion of the resist that was on the defect is removed. Thereafter, in this status, by using either the vapor deposition or the spattering method, a light intercepting film of a metal such as chrome is formed. Then, separating the photoresist leaves the light intercepting film only on the defects so that white defects such as pinholes and the like are rendered light-intercepting.

Hard masks have dimensions in the order of several inches square but the size of emulsion masks is large and is in the order of 20 to 40 inches. For this reason, in the case of the emulsion masks, the series of methods described above, which use vapor deposition and spattering, require large-scale coating apparatus and large-scale vacuum apparatus and the like. Since this is difficult as far as the facilities are concerned, it is more general to cover the defect by India ink applied manually using a brush having a fine hair tip.

With the pattern repairing method described above for black dot defects, a YAG laser with a wavelength of 1060 nm and a second harmonic of 530 nm enables fine defect repair, but the portion around that portion for which removal processing was performed swells. In addition, the removal of the defect portion cannot be made linear and so there is the problem of ruggedness.

When a YAG laser is used for defect removal, the swell of the peripheral portion of the defect amounts to 50% of the thickness of the layer and this becomes a cause of improper contact in uses where contact exposure is performed, thereby causing problems for its practical use. In addition, the non-linearity of the removed portion also presents a problem of quality now that finer patterns are being required.

In addition, the previously described method for the repair of white defect has its application limited to those which do not require precision and for which the defects are not connected to or adjacent to portions that do not have defects, and it is not possible to use it for the repair in the case of photomasks used for semiconductor manufacturing or fine processing.

SUMMARY OF THE INVENTION

The object of the present invention is to provide a method for the repair of defects in emulsion masks and the like, by removing defective portions without providing an adverse influence to a portion that is peripheral to the defects, and with favorable finish processing for the defects.

Another object of the present invention is to provide a novel and effective apparatus for repairing defects in emulsion masks and the like.

According to an aspect of the present invention, there is provided a method for repairing a defect of an emulsion mask or the like, comprising the steps of: irradiating ultraviolet light to the defect in a shape corresponding to the defect; and destroying the defect as a result of the irradiation. The ultraviolet light is preferably a laser beam of an excimer laser.

According to another aspect of the present invention, there is provided an apparatus for repairing a defect of an emulsion mask or the like, comprising an ultraviolet light source for generating ultraviolet light, aperture means for passing the ultraviolet light therethrough for shaping the same; and means for projecting the ultraviolet light onto the emulsion layer to form an image of the aperture on the defect so as to remove the defect.

Preferred embodiments of the present invention will be described further in detail hereunder, with reference to the accompanying drawings.

BRIEF DESCRIPTION OF THE DRAWINGS

FIG. 8 is a flow chart indicating steps for repairing a white defect portion by using a method according to the present invention;

FIG. 9A through FIG. 9D are schematic perspective views of an emulsion mask corresponding to the steps of FIG. 8;

FIG. 10 is a schematic perspective view of the emulsion mask prior to repair;

DESCRIPTION OF THE PREFERRED EMBODIMENTS

The following is a detailed description of preferred embodiments according to the present invention.

Figure 1:
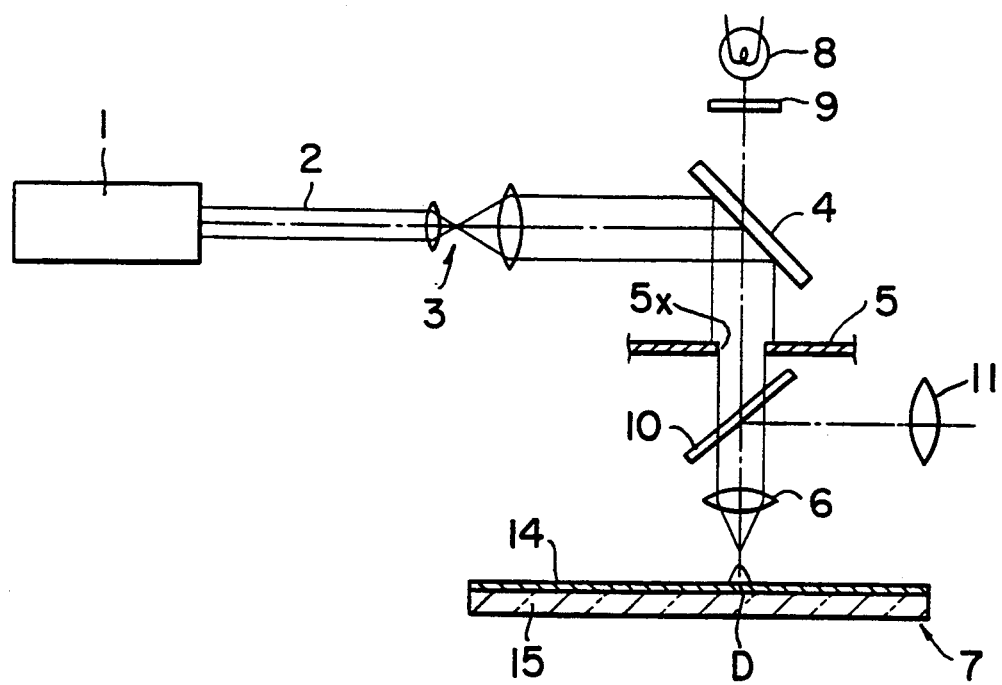
FIG. 1 is a schematic view illustrating an apparatus that uses a laser beam to perform the repair of a black defect portion according to the present invention.

FIG. 1 is a schematic view illustrating an apparatus that uses a lens to focus a laser beam from a laser light source and irradiate it onto an emulsion surface of an emulsion mask 7 in order to correct or repair a black dot defect portion D of the emulsion mask 7.

The ultraviolet laser beam 2 from a laser oscillator 1 is magnified by a beam expander 3 and only the ultraviolet light of the beam is reflected by a selectively reflective mirror 4. A beam image is formed by an aperture 5x in an aperture forming portion 5 so as to correspond to a shape of a defect. The beam is then reduced and projected by an image-forming lens 6 so that it is irradiated to an area of the emulsion mask 7 corresponding to a black dot defect portion D of the emulsion surface.

In addition, white light from a reference light lamp 8 is colored by a colored filter 9 and irradiated through the aperture 5x and the image-forming lens 6, projecting the shape of the aperture 5x onto the emulsion mask 7 as a colored image. A condenser lens (not shown) may be provided before the reference light lamp 8 to make the illumination uniform. The shape that is projected onto the emulsion mask 7 can be observed through an observation lens 11 by reflecting the shape by a half mirror 10.

Figure 2:
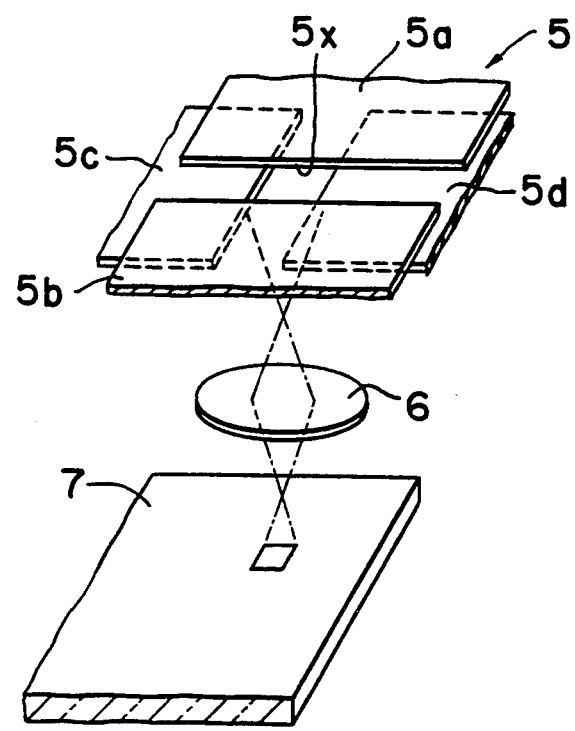
FIG. 2 is an enlarged perspective view indicating the relationship between an aperture forming portion, an image forming lens and an emulsion mask.

FIG. 2 is an enlarged perspective view indicating the relationship between an aperture forming portion 5, an image-forming lens 6 and an emulsion mask 7. The aperture forming portion 5 comprises four blades 5a, 5b, 5c and 5d and each of the blades can be advanced and retracted and can be rotated. This is to say that by controlling the position of the blades the shape of the beam can be made to correspond to the shape of the defect, as indicated in the examples shown in FIG. 3A through FIG. 3E.

Figure 3A:
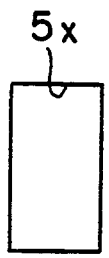
FIG. 3A through FIG. 3E are elevational views indicating the shapes of various types of apertures formed by blades of the aperture forming portion.
Figure 3B:
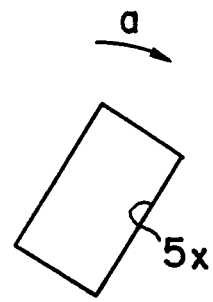
Figure 3C:
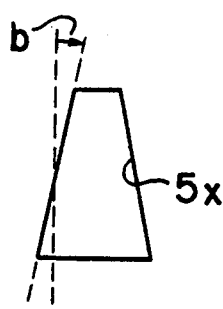
Figure 3D:
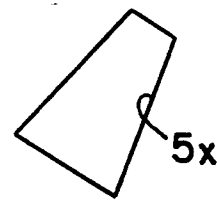
Figure 3E:
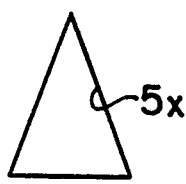

Rotating the blades 5a through 5d as indicated by the arrow a in FIG. 3B, rotating some of the blades as indicated by the arrow b in FIG. 3C, or rotating each blade individually can be performed to create apertures of various shapes. This is to say that trapezoidal shapes, triangular and other shapes can be created in addition to rectangular shapes and that such shapes can be rotated in an arbitrary direction with respect to the optical axis.

The image-forming lens 6 reduces and projects the beam image that has been shaped by the aperture 5x. The defect portion can range from several mm to several tens of $\mu$m and to about several $\mu$m. It is advantageous to manufacture the aperture forming portion 5 with an enlarged dimension and then use reduction projection. The energy density of the laser beam irradiated to the aperture forming portion 5 is weakened to such a degree that there is no damage to the aperture forming portion 5 and the image-forming lens 6 performs reduction projection to raise the energy density to that required for the removal of the defect portion.

Figure 4:
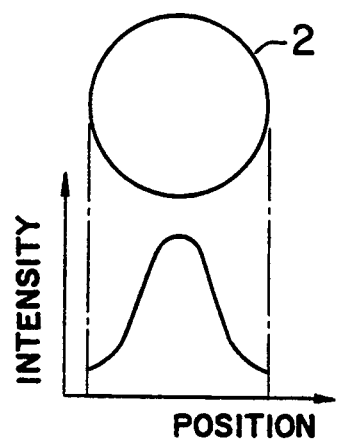
FIG. 4 is a sectional illustration of a laser beam and a graph indicating its intensity.

Normally, as indicated in FIG. 4, the ultraviolet light laser beam 2 that is output from the laser oscillator 1 has a density distribution which is largest at the central portion of the beam 2 and is smaller towards the periphery. In this status, it is difficult to perform uniform processing since the processing speed due to the laser irradiation differs in the central portion from that of the peripheral portion. Because of this, an optical system using a beam expander 3 is used to enlarge the beam so that only the central portion for which the beam is uniform is selectively used. In addition, the beam expander 3 is also used to correspond to the enlarged aperture because the beam is irradiated to a relatively large area.

If the sectional area of the ultraviolet light laser beam 2 that is obtained from the laser oscillator 1 is relatively large and the intensity distribution is not extremely poor, then an adequate result can be obtained without the use of the beam expander 3.

An excimer laser is used as the laser oscillator 1 that oscillates to produce ultraviolet light. It is possible to have several types of ultraviolet light oscillations depending upon the type of halogen gas used in the excimer laser. The typical oscillation wavelengths are 308 nm (XeCl), 248 nm (KrF) and 198 nm (ArF), and the oscillation wavelength can be changed by exchanging the gas. The laser wavelength that is used for defect portion removal can be chosen from these three types but the permittivity ratio of the lens of the optical system deteriorates from about 200 nm and therefore either 248 nm or 308 nm is suitable.

The laser energy necessary for defect portion removal is optimum at an energy density of 5 to 50 J/cm$^2$ at the position of irradiation, and the pulse energy of the laser oscillator 1 is about 100 to 400 mJ/pulse.

The actual procedure for removing defect portions is as described below. The observation lens 11 is used to observe the emulsion mask 7 and the position of the emulsion mask 7 is determined so that the defect portion D on the emulsion mask 7 is positioned at the center of the field of view. Then, the shape of the aperture 5x of the aperture forming portion 5 is projected onto the emulsion mask 7 by the colored light from the reference light lamp 8 and is made into dimensional alignment with the shape of the defect portion. This adjustment is made by advancing or retracting the blades 5a through 5d and adjusting their angles. In this status, the ultraviolet light laser beam 2 is output from the laser oscillator 1, magnified by the beam expander 3, and irradiated to the aperture forming portion 5. The beam corresponding to the shape of the aperture 5x produced by the blades 5a through 5d is reduced by the image-forming lens 6 and irradiated to the defect portion on the emulsion mask 7 to destroy and therefore remove the defect.

Figure 6:
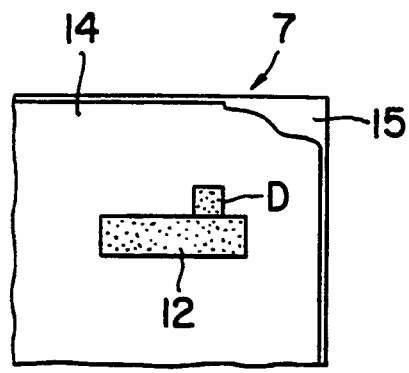
FIG. 6 is a plan view of an emulsion mask having a black dot defect portion.
Figure 7:
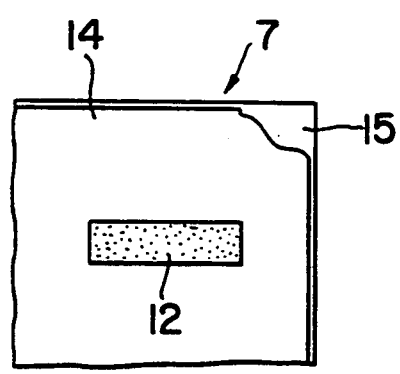
FIG. 7 is a plan view of the emulsion mask of FIG. 6 from which the black dot defect portion has been removed.
Figure 14:
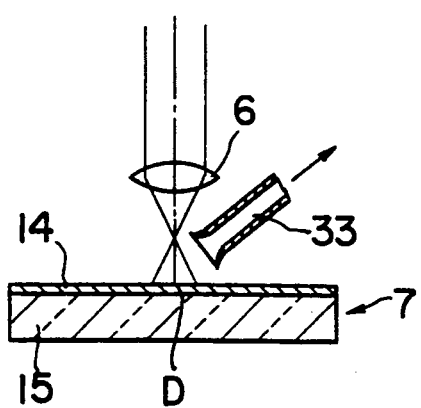
FIG. 14 and FIG. 15 are partial views showing modifications of the embodiment indicated in FIG. 13.

The method described above can be used to remove a black dot defect portion D as indicated in FIG. 7, from an emulsion mask 7 requiring the repair of the black dot defect portion D that is connected to an image portion 12 as indicated in FIG. 6. In FIGS. 6 and 7, 14 represents a transparent emulsion layer and 15 represents a glass substrate. By the use of an ultraviolet light laser, it is also possible to remove protruding defects (where the film surface is high) that are transparent in visible light.

Figure 5:
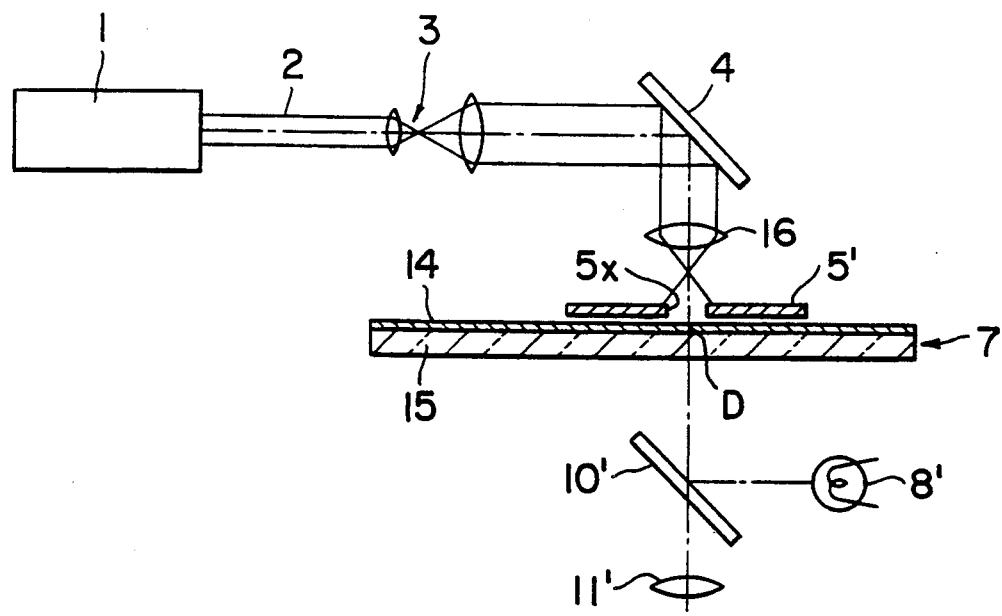
FIG. 5 is a schematic view of a different apparatus from that shown in FIG. 1.

FIG. 5 shows a view of another embodiment according to the present invention. A beam 2 from a laser oscillator is magnified by a beam expander 3, and a selectively reflective mirror 4 changes the direction of this beam to that of the emulsion mask 7. A focussing lens 16 focuses the central portion of the laser beam for which the energy intensity is relatively uniform. The aperture forming portion 5' is positioned to the position of the black dot defect portion D on the emulsion mask 7 and brought into contact with the surface of the mask, and the beam 2 is irradiated through the aperture forming portion 5'. When compared to the method in FIG. 1 where an aperture image is formed, this embodiment has the aperture forming portion 5' in direct contact with the emulsion mask 7 so that it is not necessary to have lens focussing. This embodiment therefore has the advantage of being easier to use. In this embodiment, light from a reference light source 8' is irradiated to the aperture forming portion 5' from the rear side of the emulsion mask 7 and through a half mirror 10', and in the same manner, an observation lens 11' on the rear side of the emulsion mask 7 is used for monitoring while the position of the black dot defect portion D is determined.

As has been described above, the application of the present invention is not limited to the silver emulsion of an emulsion mask that uses a silver emulsion photographic plate, and the present invention can also be used for the repair of emulsion masks using non-silver emulsion photographic plates such as glass substrates which have their surfaces applied with a diazo photo-sensitive liquid (a photo-sensitive liquid which is a mixture of diazo compound and a coloid substance such as gelatine and the like) and which has an image printed onto it and then colored to form an image portion made of an organic high polymer layer. The present invention is also applicable to the repair of organic layer patterns of color filters for use in LCD or CCD.

As has been described above in detail, the method described can be used to precisely remove semi-transparent defect portions, transparent and protruding defect portions, or black dot defects of emulsion masks. The method has the advantage of being able to remove defect portions without damaging non-defect portions even if those defect portions are continuous with or adjacent to those non-defect portions.

Moreover, other than the previously described oscillation wavelengths for the excimer laser, 351 nm (XeF), 222 nm (KrCl) or 157 nm (F$_2$) may also be used as the laser source. In addition, it is possible to use wavelengths in the vicinity of 200 nm or less by using a reflective optical system instead of the glass lens.

In the above embodiment, an excimer laser is used as the ultraviolet light laser source but it is also possible to use the fourth harmonic (266 nm) and the third harmonic (355 nm) of a YAG laser, and the use of any laser source in the vicinity of ultraviolet light is possible.

A method for correcting white defects in an emulsion mask will be described below.

FIG. 8 is a flow chart indicating the procedure of a method for repairing a white defect portion. FIG. 9A through FIG. 9D are schematic perspective views of an emulsion mask corresponding to the steps of FIG. 8. FIG. 10 is a schematic perspective view of an emulsion mask prior to repair.

An emulsion layer 14 on a glass substrate 15 of the emulsion mask 7 has an image c printed onto it by an exposure. In FIG. 10, D' is a pinhole or a hole forming a white defect in this image c. The size of the white defect D' ranges from the order of 1 mm to several tens of $\mu$m or several $\mu$m.

The following is a description of the procedure for the repair of this emulsion mask 7 having such a defect portion D'.

In step 1, a weakly adhesive resin 17 is coated to the emulsion mask 7. Centering around the defect portion D' of the image c printed onto the emulsion layer 14, this resin is applied, as shown in FIG. 9A, as a layer 17 that can be removed from around the defect portion D'.

This weakly adhesive resin 17 can be a vinyl resin such as PVC, vinyl acetate or vinyl butyral or the like, a copolymer of vinyl acetate and vinyl hydrochloride, or a thermoplastic high-polymer material such as polyester, polyurethane or polyepoxy or the like which is dissolved in an organic solvent. The thus prepared liquid is coated by using a sponge brush or the like with the width of application of about 1 to 2 mm.

In step 2, an ultraviolet light laser beam is irradiated to the weakly adhesive resin 17 coated to the emulsion mask 7 and in alignment with the defect portion D' for which repair is required. Thus, portions of the weakly adhesive resin 17 and the emulsion layer 14 are removed or recessed as indicated at 18 in FIG. 9B. This removed portion 18 is, for example, in the shape of a parallelepiped which includes the defect portion D'. There is no actual problem even if this removal process does not remove the emulsion layer 14.

Figure 11:
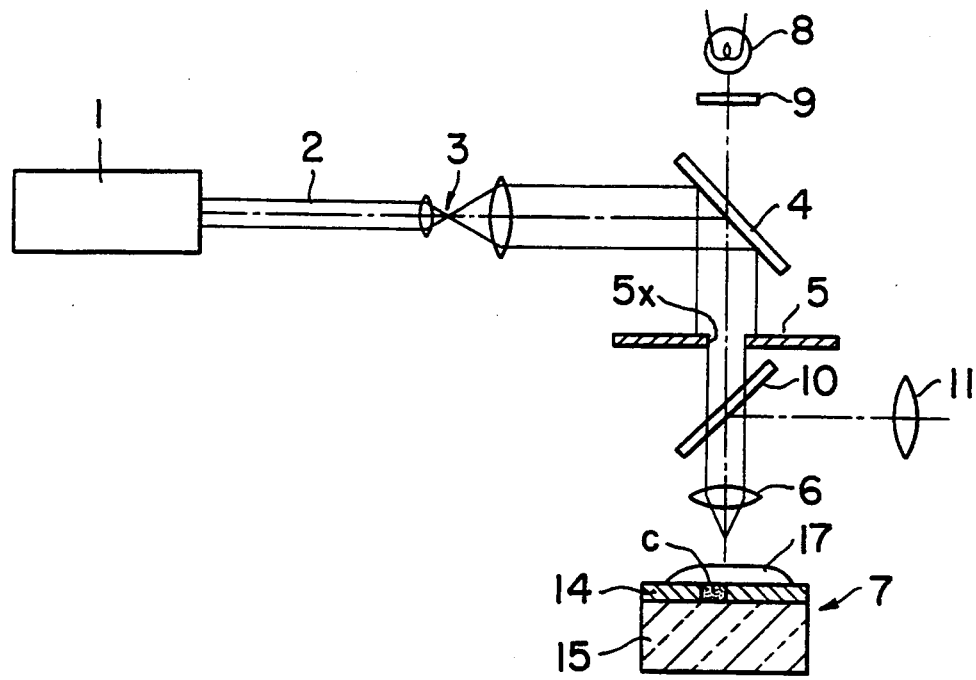
FIG. 11 is a schematic view of the repair using an ultraviolet laser beam irradiation apparatus.

The apparatus for irradiating the ultraviolet light laser beam used for this removal is shown in FIG. 11, and is the same as the apparatus indicated in FIG. 1.

The wavelength used is 248 nm in the case KrF is used as the gas source. The laser power is about 100 to 400 mJ per pulse.

In step 3, a light intercepting pigment 19 is applied to the weakly adhesive resin 17 as shown in FIG. 9C so as to fill the removed portion 18 from which the weakly adhesive resin 17 and the emulsion layer 14 have been removed. A black-colored pigment such as carbon black or the like, dissolved in water is used as the pigment 19.

The pigment may contain an adhesive component, which facilitates adhesion of the pigment to the glass substrate 15 exposed by the removed portion 18. An India ink that has been conventionally used may also be used as the light intercepting material. Furthermore, a black pigment material other than carbon black can also be used if it can block the component of the light wavelength that has to be blocked. The area of the application of the pigment is not limited to that area centering around the removed portion 18, and can be roughly applied without requiring skilled manual application using a fine brush or a precision positioning mechanism.

In step 4, the removable weakly adhesive resin 17 that has been also applied around the defect portion D' is separated. Adhesive tape such as "Scotch tape" or the like is used for this separation. Separation of this adhesive tape causes the weakly adhesive resin 17 adhering to the adhesive tape to be pulled away from the emulsion layer 14. As mentioned before, the weakly adhesive synthetic resin 17 is used so that there is no damage caused to the surface of the emulsion layer 14 when the separation is made.

The light intercepting pigment 19 applied to the surface of the weakly adhesive resin 17 is separated together with the resin 17, whereby the pigment 19 applied to the removed portion 18 remains as it is as indicated in FIG. 9D, and the removed portion 18 is filled with the pigment 19 so that the repair of the white defect portion D' is performed.

Figure 12:
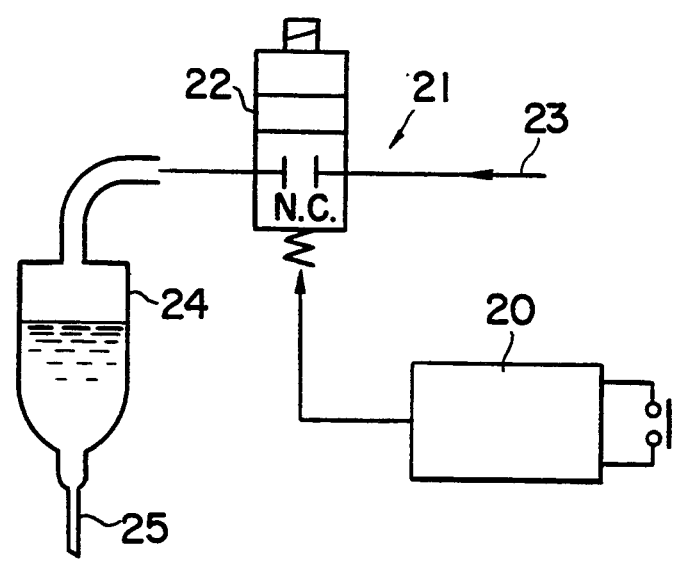
FIG. 12 is a view of a microdispenser.

The application of the weakly adhesive resin 17 in step 1, and the application of the light intercepting pigment 19 in step 3 can be performed using a microdispenser (an apparatus that discharges constant amounts of a liquid) 21 as indicated in FIG. 12. The microdispenser 21 has an application agent inside a tank 24 and this application agent is sent through a pipe 23 via a solenoid valve 22 controlled by a timer 20 and is discharged through a nozzle 25 by compressed air.

In step 1, instead of applying and drying the liquid protective layer, it is possible to apply a film of PET or the like having a thickness of several $\mu$m and having a weak adhesive applied to one surface thereof. The film can then be applied to the entire surface of the defect portion or the defect portion D' of the image c that is printed onto the emulsion layer 14.

Furthermore, the weakly adhesive resin 17 that is coated to and formed on the surface of the emulsion layer 14 may be a liquid-expelling agent. The light intercepting agent that is applied to the removed portion 18 may be a hydrophilic substance such as water-soluble ink or pigment so that its adhesion to portions other than the removed portion 18 is prevented when applied, and so that the repair of the defect portion D' after the separation of the resin 17 can be performed stably.

According to the method described above, it is possible to accurately repair a white defect such as a pinhole or missing portion in an emulsion mask or the like, and furthermore, this repair of defect portions is possible without damaging non-defect portions even if the defect portion is connected to or is adjacent to non-defect portions. In addition to pinholes and missing portions, it is also possible to regenerate patterns that have fallen off completely.

Figure 13:
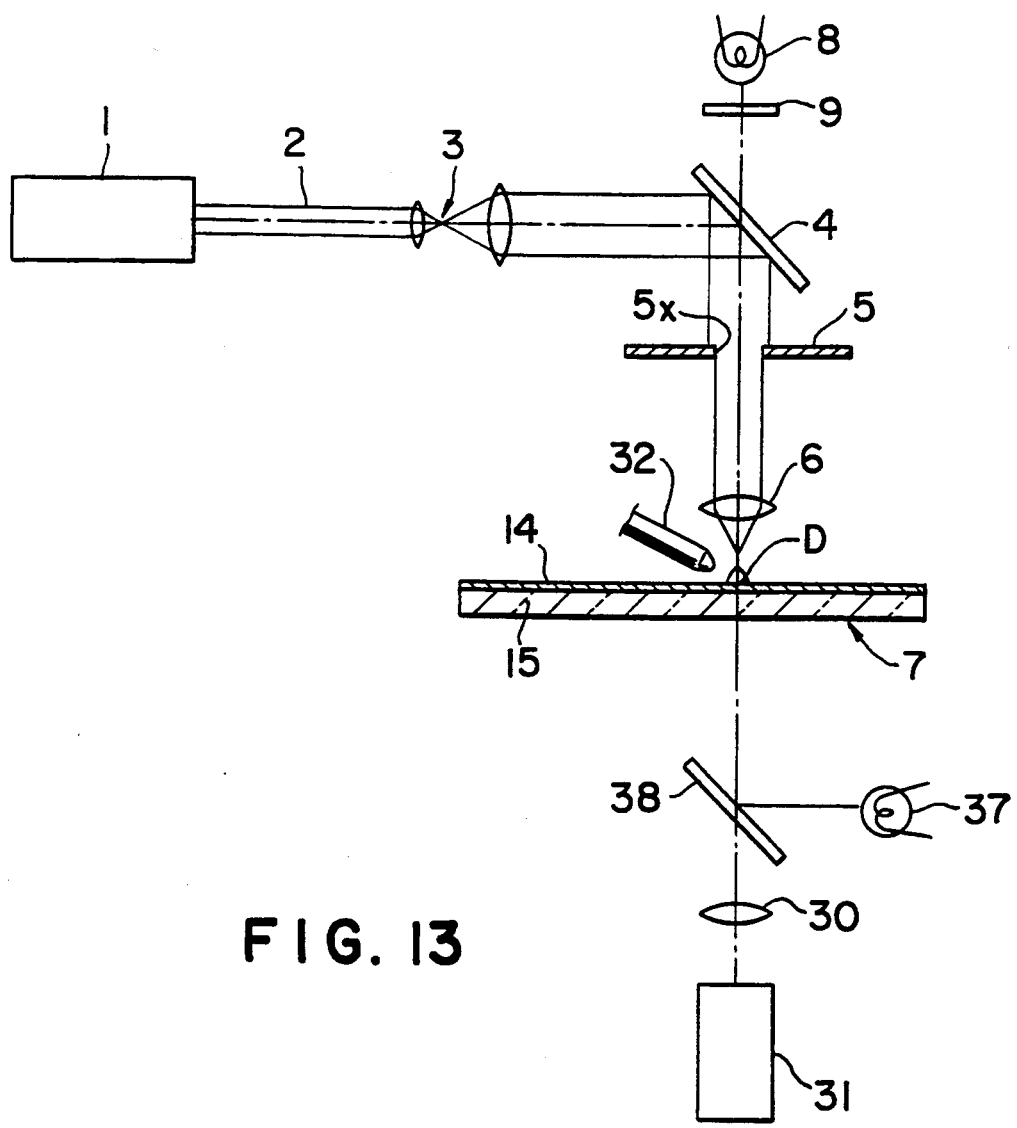
FIG. 13 is a schematic view indicating another embodiment of the apparatus that uses a laser beam to perform the repair of defects.

FIG. 13 is a view indicating another embodiment of an apparatus that uses a laser beam to perform the repair of defects. In this Figure, those portions that are the same as corresponding portions in FIG. 1 are indicated using the same numerals, and the corresponding description of them is omitted.

In this apparatus, an observation lens 30 and an image-forming lens 6 are located at opposite sides with respect to the emulsion mask 7, and a television camera 31 is used for observation via the observation lens 30.

Figure 15:
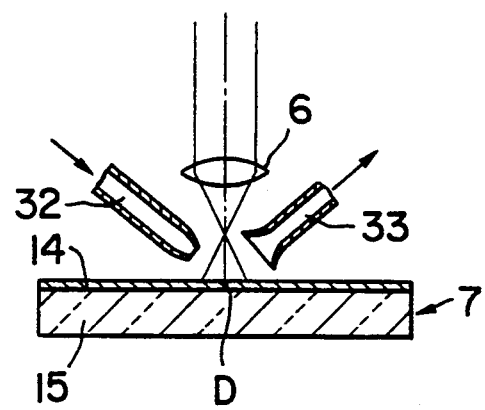

In addition, in the vicinity of the irradiation portion D of the emulsion mask 7 to which the laser light is irradiated through the image-forming lens 6, an air ejection nozzle 32 is provided at one side. As shown in FIG. 14, an air suction nozzle 33 may be disposed at a position opposite the air ejection nozzle 32 with respect to the irradiation portion D of the laser light. Furthermore, as indicated in FIG. 15, air may be ejected from the air nozzle 32 to the irradiation portion D on the emulsion mask 7 and this air can be sucked out through an air suction nozzle 33.

It is extremely difficult as far as the design of the optical system of the lens is concerned, to use a lens that resolves light ranging from visible light up to the ultraviolet light of the laser and without aberration. Lenses that can do this are very expensive and because of this, the lens that is used is one that has a favorable resolution for the laser ultraviolet light.

Since a lens that is suitable for use in the ultraviolet light region is used as the image-forming lens 6, the colored filter 9 is a blue filter to produce reference light of a wavelength in the vicinity of the ultraviolet light of the reference light lamp 8.

The observation lens 30 is disposed coaxially with the image-forming lens 6 so that it is possible to observe the portion D of the emulsion layer 14 which is irradiated by the laser, from the rear surface of the glass substrate 15, and has an independent illumination system 37, 38.

The observation lens 30 is a lens that has a favorable resolution in the visible light region. An image of an aperture 5x formed by illumination by the reference light lamp 8 and the status of the laser irradiation portion D are observed through the illumination system 37, 38 and the reference light lamp 8 adjusted to observe the image through a television camera 31.

The air ejection nozzle 32 is disposed so that the air is blown in the vicinity of the optical axis of the image-forming lens 6 on the emulsion mask 7 and normally, when the laser light is being irradiated, is blown so as to remove particles of the emulsion layer 14 that are removed and separated by the laser irradiation.

The range of irradiation of the laser beam is small at from several tens of $\mu m$ to several $\mu m$ so that only a small air flow is required. Sufficient use can be achieved without a high pressure.

Figure 16:
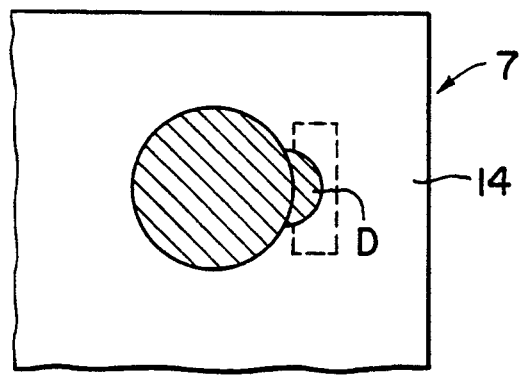
FIG. 16 is a plan view showing yet another example of a defect portion.

The aperture forming portion 5 will be described below in more detail. When a rectangular pattern using only linear components is to be formed on an emulsion mask 7, this can be achieved using only the aperture blades 5a through 5d, but in cases where the pattern includes a curved component such as the defect portion D indicated in FIG. 16, where there is a protrusion from a circular pattern, it would be difficult to remove all of the defect portion D with one laser irradiation if an aperture comprising only linear blade portions was used.

Figure 17A:
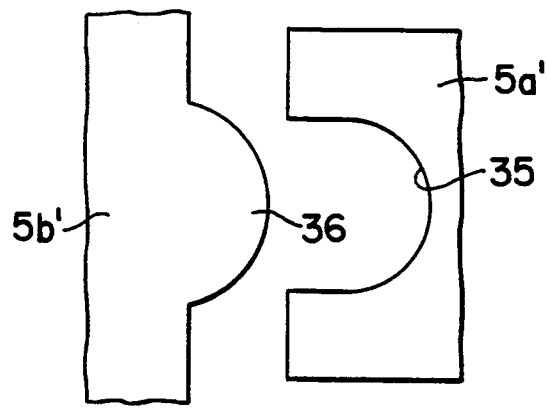
FIG. 17A is a fragmentary enlarged plan of two blades having different radii of curvature of their respective protruding and cutout portions.
Figure 17B:
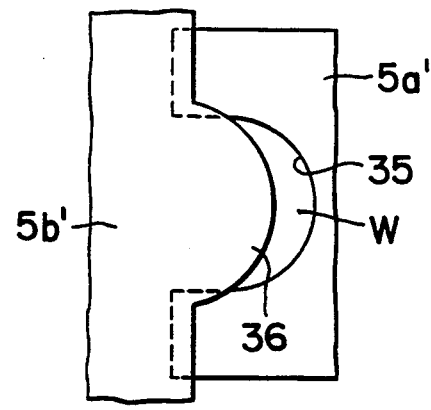
FIG. 17B is a fragmentary enlarged plan of the two blades of FIG. 17A when they are overlaid.

In such a case, the removal of a defect portion D having a portion with a curved shape is achieved by using aperture forming blades 5a' and 5b' that have a semicircular cutout 35 and a semicircular protrusion 36 of different radii of curvature as indicated in FIG. 17A, at the linear edges of linear blades 5a through 5d as shown in FIG. 2. By sliding and overlapping them as indicated in FIG. 17B, a crescent-shaped aperture is formed.

In addition, blades 5a' and 5b' having semicircular cutouts and protrusions of different sizes and radii of curvature may be used in combination with linear blades 5a through 5d so that they can be exchanged and rotated for use with respect to defect portions in an arbitrary direction.

Figure 18:
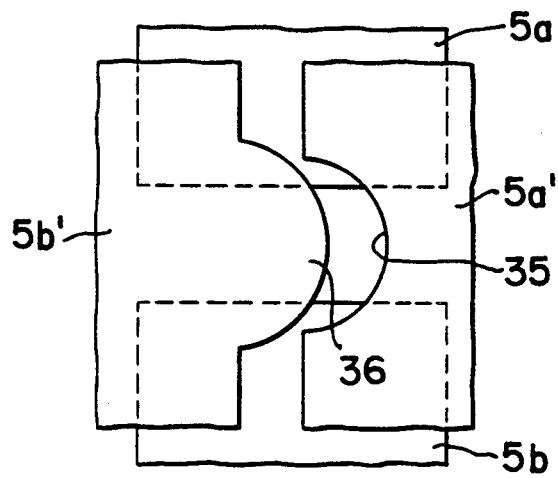
FIG. 18 is an enlarged plan view showing a state in which blades with a linear shape are overlaid on blades having circular protrusion and cutout which have different radii of curvature.
Figure 19:
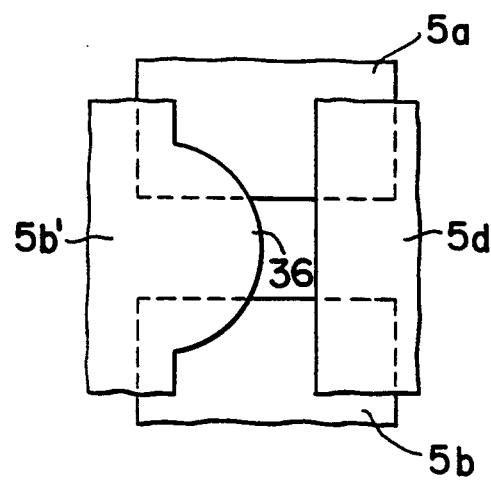
FIG. 19 is an enlarged plan view indicating a state in which blades with a linear shape are overlaid on a blades having a circular protrusion.

FIG. 18 indicates a combination of blades 5a' and 5b' having semicircular cutout 35 and protrusion 36 of different radii of curvature in a direction perpendicular to blades 5a and 5b, while FIG. 19 indicates a combination of a blade 5b' having a semicircular protrusion 36 and a linear blade 5d that are in the perpendicular direction with respect to linear blades 5a and 5b. The aperture is therefore formed by two lines and two curves or by three lines and one curve.

Figure 20:
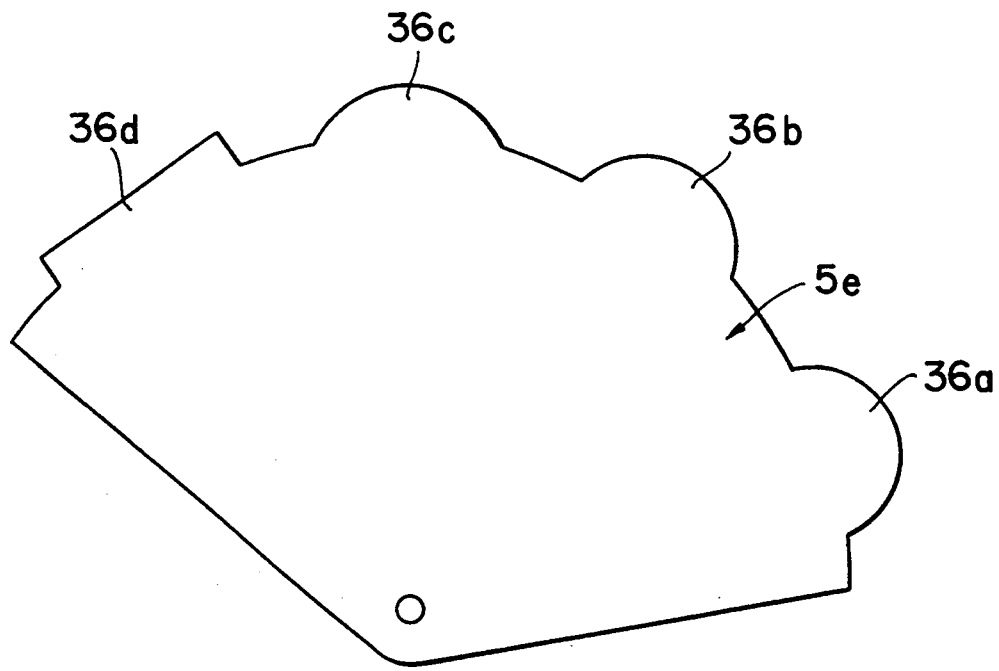
FIG. 20 is an enlarged plan of a blade having linear portions and multiple curved portions of different radii of curvature.
Figure 21:
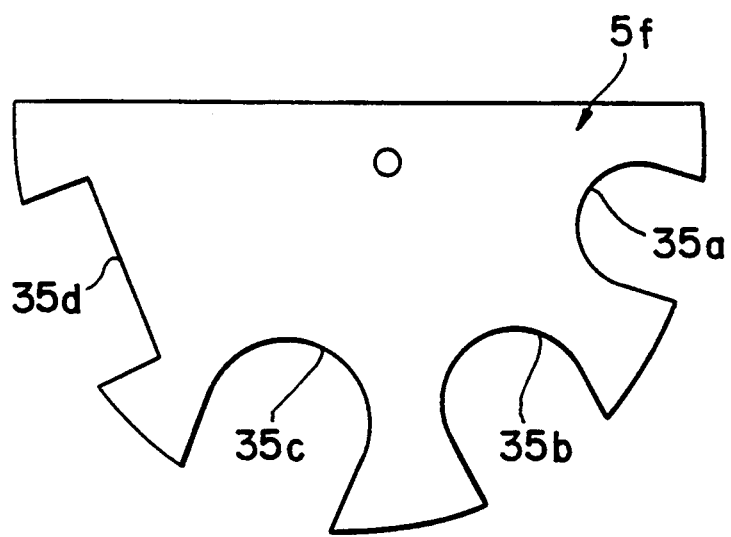
FIG. 21 is an enlarged plan of a blade having a linear portion and multiple cutout portions of different radii of curvature.
Figure 22:
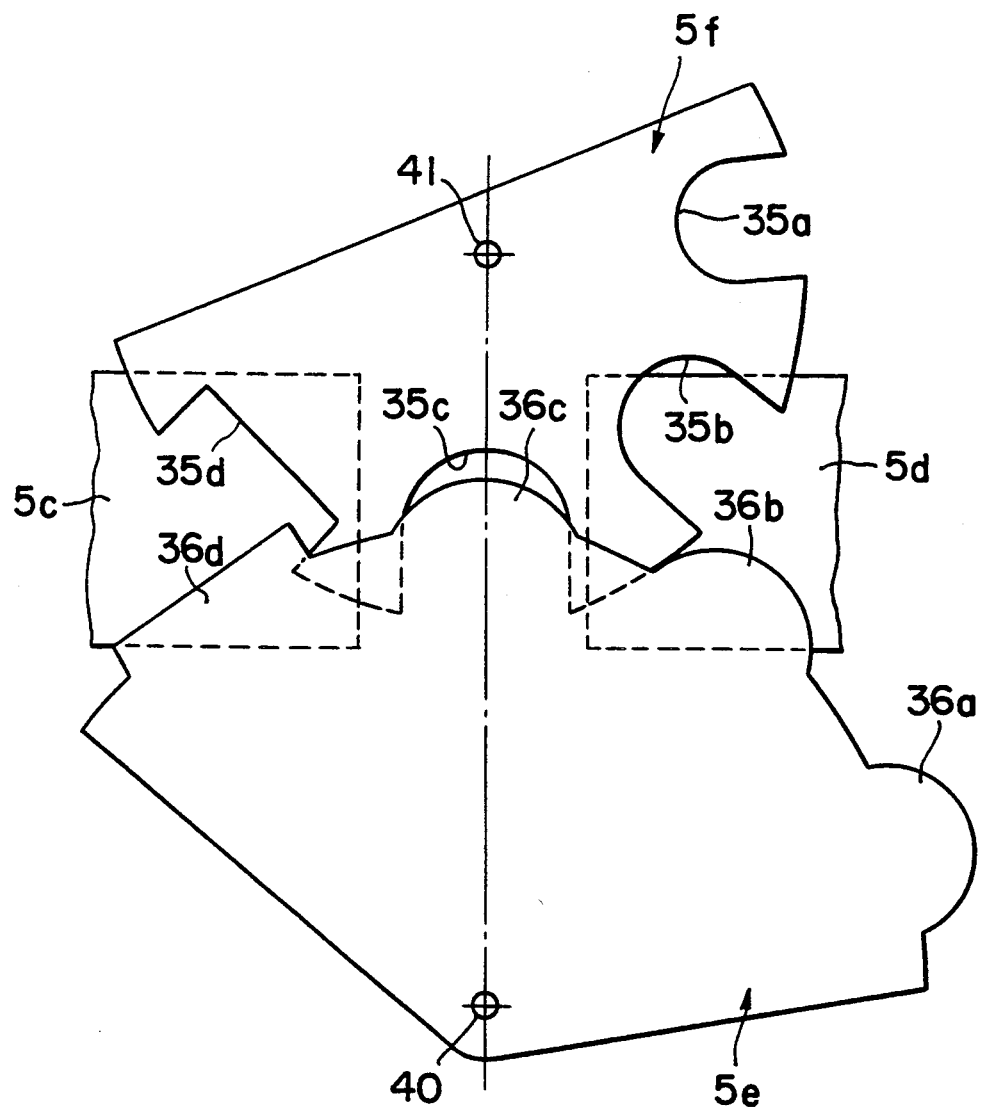
FIG. 22 is an enlarged plan of a state in which the blades of FIG. 20 and FIG. 21 are overlaid.

FIG. 20 indicates a single blade 5e having a linear protrusion portion 36d and semicircular protruding portions 36a, 36b and 36c of different radii of curvature, while FIG. 21 indicates a blade 5f that has a linear cutout portion 35d and semicircular cutout portions 35a, 35b and 35c of different radii of curvature. These blades are arranged as shown in FIG. 22, so that they can rotate independently with respect to spaced rotational axes 40 and 41. By providing linear blades 5c and 5d extending in a direction perpendicular to the line joining the two axes 40 and 41 and by sliding and rotating the blades 5e, 5f, 5c and 5d, a variety of shapes of the aperture can be formed so as to correspond to various types of shapes of defect portions.

The various types of blades described above can be formed by performing electrical discharge processing, etching processing, or mechanical processing or the like on a metal plate, but they can be formed by the vapor deposition or spattering of a metal film onto quartz glass, or by the adhesion of a metal foil.

In the apparatus indicated in FIG. 13, the defect portion that is dispersed by the laser beam can be either blown away by the air from the air ejection nozzle 32, sucked in by the air suction nozzle 33 as indicated in FIG. 14, or either blown away by the air from the air ejection nozzle 32 and sucked in by the air suction nozzle 33 as indicated in FIG. 15.

Figure 23:
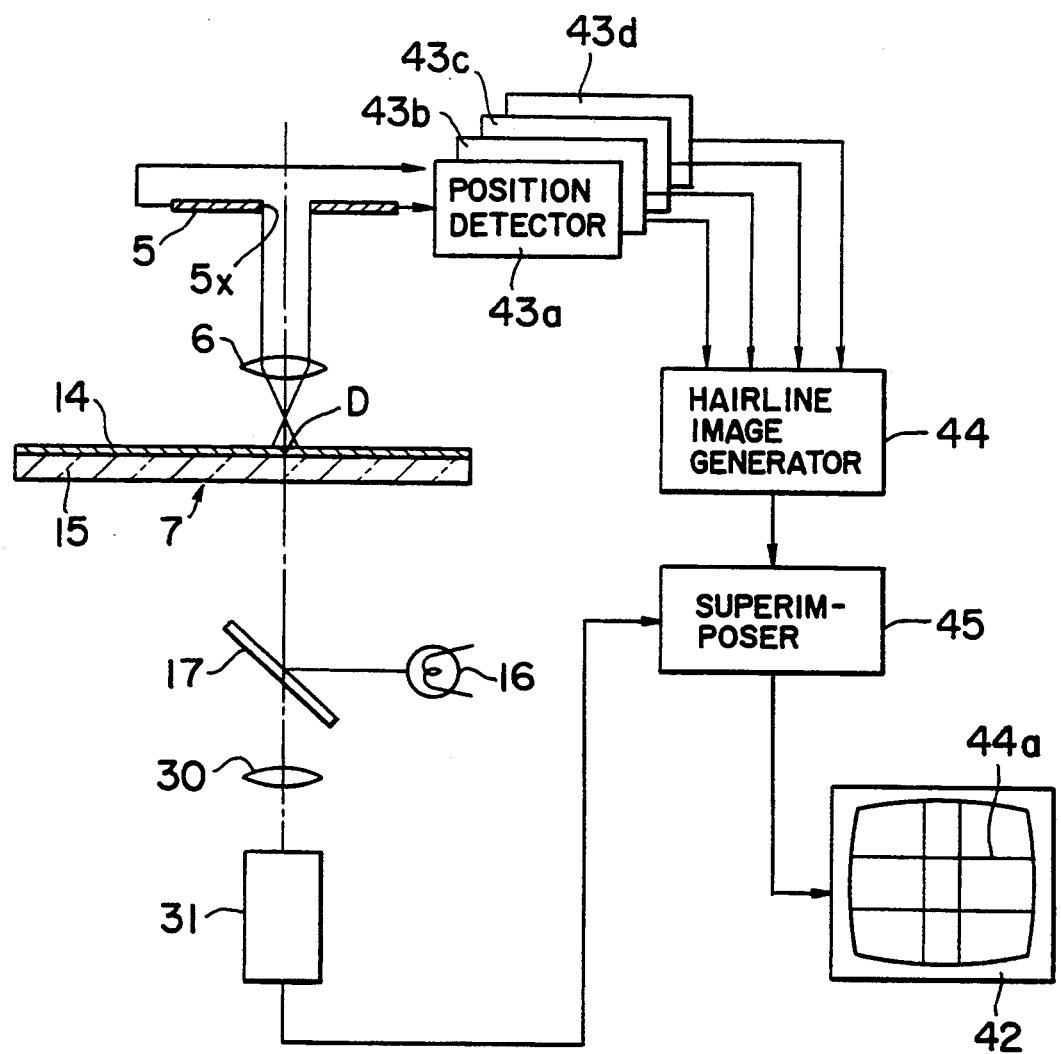
FIG. 23 is a schematic view showing yet another embodiment of an apparatus that uses a laser beam to perform the repair of defects.

FIG. 23 indicates yet another embodiment of the apparatus according to the present invention.

In the apparatus of FIG. 13, the aperture image projects the light from the reference light lamp 8 onto the emulsion mask 7 by the image-forming lens 6 and the apparatus is configured so that it is possible to observe this via the observation lens 30. However, in the apparatus indicated in FIG. 23, there is provided a television camera 31, which operates to display on a monitor screen 42 the emulsion layer observed through an observation lens 30. On the other hand, the aperture image corresponding to the degree of opening of the aperture blades 5a through 5d is monitored on the monitor screen 42, and overlaps the image from the observation lens 30.

More specifically, there are provided position detectors 43a through 43d that detect the position of the respective blades 5a through 5d, and a hairline image generator 44 that generates hairline images corresponding to the blade position detection signals from the position detectors 43a through 43d. A superimposer 45 operates to superimpose the image signals for the hairline images and the image signals from the television camera 31.

When the blades 5a through 5d are adjusted, the position detectors 43a through 43d read the positions of the respective blades, and these positions corresponding to the edges of the blades are generated as a hairline image by the hairline generator 44, and the shape of the aperture is displayed as a hairline image 42a on the monitor screen 42.

In the embodiments indicated in FIG. 13 and FIG. 23, the surface of the emulsion layer 14 of the emulsion mask is faced upwards. However, the surface may face downward and the laser light may be irradiated from below, with observation performed from above so that the emulsion layer 14 that is dispersed when the laser light is irradiated may fall by gravity and may not re-adhere to the layer.

In the apparatus that has been described above, the image-forming lens 6 that reduces and projects the aperture image is used also as a lens for observation and is used for a resolution for both visible light and ultraviolet light. As a matter of fact, it is not easy to manufacture a lens that is applicable to both visible light and ultraviolet light and that has no aberration, and the manufacture of a lens usable for the two purposes requires a large amount of money and time. In addition, in the previously described embodiments, the lens for observation is provided separately from the lens for reducing and projecting the aperture image, so that the aperture is illuminated with a blue reference light and the lens for observation is used to observe the image that is reduced and projected by the object lens for ultraviolet light. However, the lens for the ultraviolet light region cannot obtain a sufficient degree of resolution because of distortion of the projected image.

Figure 24:
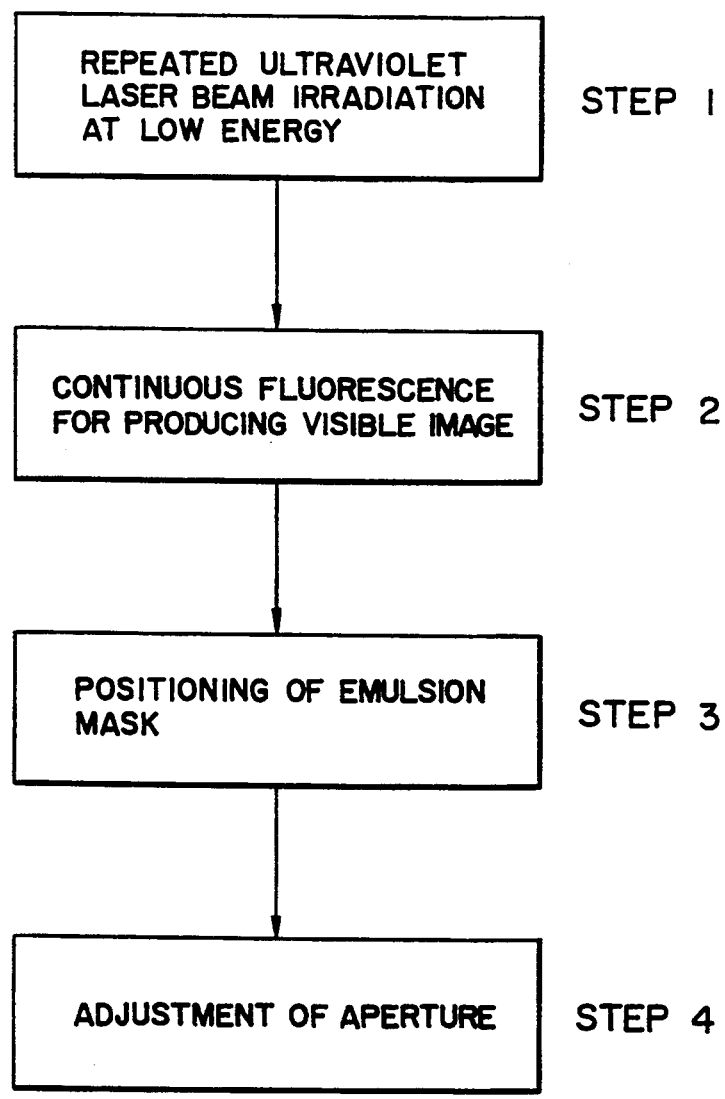
FIG. 24 is a flow chart indicating an improved method according to the present invention, for the repair of defects in an emulsion mask.

These problems can be eliminated by the method indicated in FIG. 24.

According to this method, in the apparatus indicated in FIG. 13 for example, the pulse energy of the laser light 2 from the laser oscillator 1 has an output reduced to a low energy level such as from 10 to 50 mJ/pulse and this is passed through an aperture forming portion 5 and irradiated to the emulsion mask 7. The emulsion layer 14 of the emulsion mask 7 is not subjected to a change and the removal of the layer 14 is not effected because of a sufficiently low energy of the irradiation by the ultraviolet light laser beam 2.

The ultraviolet light laser beam 2 irradiated to the aperture forming portion 5 is shaped in accordance with the aperture 5x of the aperture forming portion 5 and is reduced and projected onto the surface of the emulsion mask by the object lens. (FIG. 24; step 1)

The ultraviolet light laser beam 2 irradiated to the emulsion mask 7 excites the surface of the emulsion mask 7 but does not remove the emulsion layer 14, and fluorescence is induced so that the aperture image can be viewed by the television camera 31 as visible light.

A pulse of the ultraviolet light laser beam 2 from the laser oscillator 1 produces an instantaneous image that can be viewed by the human eye instantaneously, so that an image of the defect portion cannot be observed. For this reason, repeated oscillation of the ultraviolet light laser beam 2 is carried out to generate a continuous fluorescence so that it is possible for the aperture image to be observed as visible light (step 2).

In the status where the aperture image is observed, the emulsion mask 7 is moved to position it at the center of the aperture image (step 3).

While the aperture image is being observed in alignment with the shape of the defect portion in the center of the aperture image, the aperture blades are moved to perform adjustment (step 4).

By the above work processes, while the aperture image is being observed, it is possible to align the aperture 5x of the aperture forming portion 5 to the shape of the defect, and then the normal irradiation of excimer laser beam light through the aperture 5x and irradiation to the defect portion can accurately remove only the defect portion.

The method is not limited to the continuous oscillation of low energy laser light as has been described above, but another method can be used in which a low energy laser oscillation from a laser oscillator 1 is effected from one to several times, and an aperture image of the fluorescent light produced by the excitation due to the ultraviolet light laser beam 2 is stored in an image memory, and in which the image stored in the image memory is called and observed as the aperture image, and the above process is repeated for every time the aperture forming portion 5 is adjusted.

Figure 25:
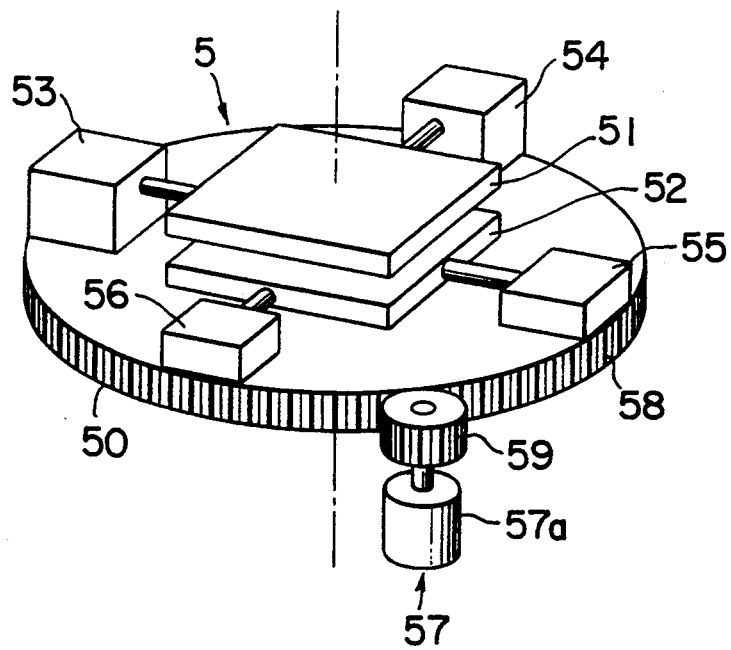
FIG. 25 is a perspective view showing a specific example of the aperture forming portion used in the apparatus according to the present invention.

FIG. 25 indicates an example of an aperture forming portion 5 where an aperture blade 51 and an aperture blade 52 are disposed on an aperture table 50, and where position adjustment mechanisms 53 and 54 are coupled to the aperture blade 51, and position adjustment mechanisms 55 and 56 are coupled to the aperture blade 52 so that it is possible to move the two blades 51 and 52 in mutually perpendicular directions.

In addition, at the side of the aperture table 50 is provided a rotating mechanism 57 that can rotate the aperture blade 51 and 52 in their entirety.

The position adjustment mechanisms 53 through 56 can be moved and adjusted by a servo mechanism, for example. In addition, the rotating mechanism 57 can have a servo motor 57a that rotates the aperture image by rotating the entire table 50 by the engagement of a rack formed along the periphery of the table 50 and a pinion gear 59.

Figure 26:
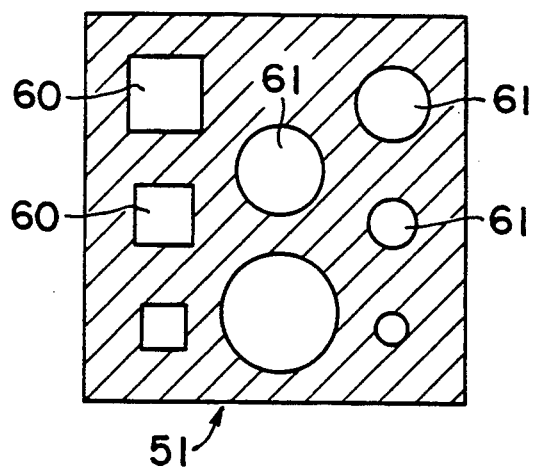
FIG. 26 and FIG. 27 are plan views of different aperture blades.
Figure 27:
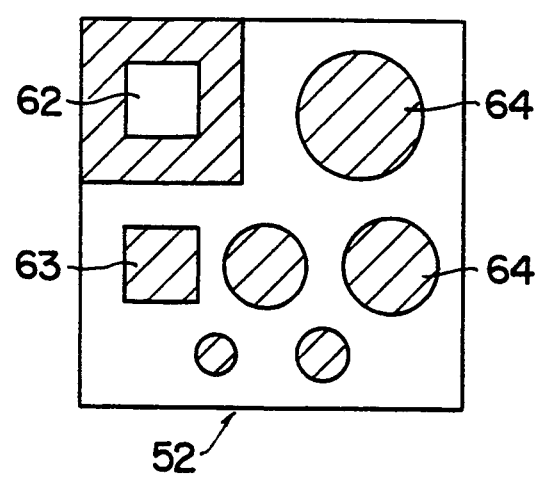

FIG. 26 indicates the shape of the aperture blade 51 and FIG. 27 indicates the shape of the aperture blade 52.

The aperture blade 51 is provided with a plural number of rectangular transparent portions 60 of different dimensions and a plural number of circular transparent portions 61 of different diameters. The aperture blade 52 is provided with one rectangular transparent portion 62, a plural number of rectangular light intercepting portions 63 of different dimensions and a plural number of light intercepting circular portions 64 of different diameters.

These two blades 51 and 52 can be moved by the position adjustment means 53 through 57 described above so that an aperture corresponding to the shape of the defect can be formed and the laser beam light shaped.

For example, in the case of a defect with a linear pattern, it is necessary to form an aperture with a variable size for the rectangle. Therefore, each of the blades 51 and 52 is moved such that the transparent portion 60 of the aperture blade 51 and the transparent portion 62 of the aperture blade 52 are positioned along the optical axis of the laser beam, and the two rectangularly-shaped transparent portions 60 and 62 overlap along the optical axis of the laser beam and form the aperture.

Figure 28:
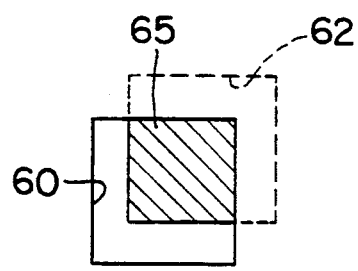
FIG. 28 through FIG. 31 are views for describing various statuses of apertures.
Figure 29:
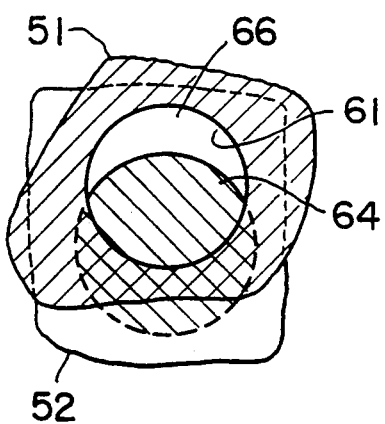

In order to match the size of the defect, the adjustment of the aperture of the aperture blade 51 is performed as indicated in FIG. 28 by moving the overlapping rectangularly-shaped transparent portions 60 and 62 relative to each other. The overlap of the two aperture blades 51 and 52 is limited to be smaller than one of the rectangularly-shaped transparent portions 60 and 62. The irradiation of laser beam light to this causes the beam passing through the aperture 65 to be shaped in accordance with the shape of the aperture 65. In the case of a defect with a curved pattern, a circle with a suitable radius of curvature is selected from the circular-shaped transparent portions 61 in the aperture blade 51 and the position adjustment mechanisms 53 and 54 are adjusted so that the selected circle is positioned at the center of the beam axis. Then, a light intercepting circle having a diameter larger than the diameter of the transparent circle selected from the aperture blade 51 is selected, and this is positioned by the position adjustment mechanisms 55 and 56 so that it is finally positioned in such a way that it is not concentric with the circular-shaped transparent portion 61 along the laser beam axis, as shown in FIG. 29. This is to say that the circular window 61 is covered by the lid 64 formed by the circle with the slightly larger diameter to form an aperture 66 that has a crescent shape, and the laser beam light is then shaped to the shape of the defect having a circular pattern.

Figure 30:
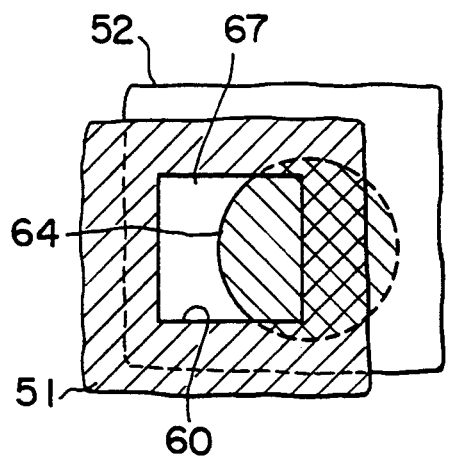
Figure 31:
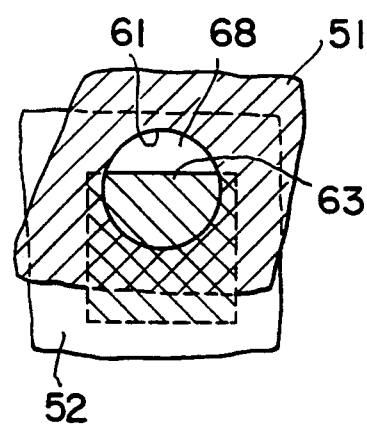

In addition, combinations of a rectangularly-shaped transparent portion 60 and a circular-shaped light intercepting portion 64 can be used to form apertures that are not crescent shaped. In this case, an aperture 67 that has an arc along one side as shown in FIG. 30 can be made to correspond with a defect. Furthermore, a combination of a circular-shaped transparent portions 61 and a rectangularly-shaped light intercepting portion 63 can be used to form a semicircular-shaped aperture as shown in FIG. 31 so as to correspond to a defect.

Other than using the position adjustment means 53 through 56 for the aperture blades 51 and 52 to determine the position of the aperture forming portion 5, it is also possible to rotate the aperture forming portion 5 and therefore perform adjustment by the rotating mechanism 57 (FIG. 25) that forms an image rotation mechanism.

Figure 32:
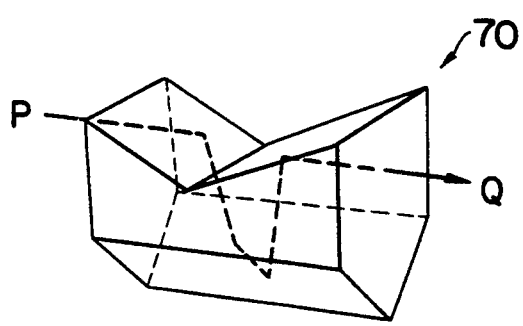
FIG. 32 and FIG. 33 are a perspective view of an image rotator prism and a perspective view of an image prism of tab type, respectively.
Figure 33:
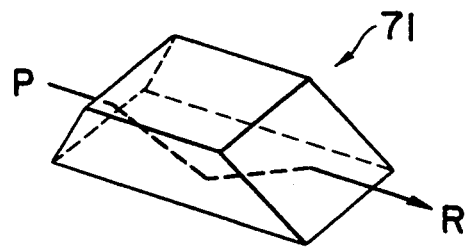

FIG. 32 indicates an example of an image rotation mechanism that rotates an aperture image by the use of an image rotator prism. Here, the aperture blades 51 and 52 do not rotate and are fixed and the rotation of the image prism 70 causes the projected aperture image to be rotated. In addition, as indicated in FIG. 33, it is also possible to use a tab-type of prism 71 that has the same function as the image rotator prism.

The aperture blade 51 and 52 can be formed by vacuum vapor deposition onto a glass substrate, of a plurality of layers of a dielectric material that reflects laser beam light. This is, the aperture blade 51 is formed by temporarily placing and fixing rectangularly-shaped and circular-shaped metal plates on a glass substrate and then performing the vapor deposition of a dielectric material thereon. The metal plates are thereafter removed from the glass substrate. Thus, an aperture blade 51 with rectangular and circular transparent portions 60 and 61 is produced. The aperture blade 52 can be formed by temporarily placing and fixing rectangularly-shaped metal plates and metal plates having circular and rectangular windows on a glass substrate and by performing the vapor deposition of a dielectric material thereon. In this case, the vapor deposition is performed in areas corresponding to the windows so that reflective light intercepting portions 63 and 64 are produced, while vapor deposition is also performed in portions other than those that have the rectangular metal plate affixed thereto, and therefore the glass substrate under those portions that are covered by the metal plates remains transparent and forms a rectangularly-shaped transparent portion 62.

Instead of a glass plate with shapes formed by vapor deposition, the aperture blade 51 may be a metal plate that has rectangularly-shaped and circular-shaped holes therethrough. Instead of a glass plate with shapes formed by vapor deposition, the aperture blade 52 may be glass plate that has a metal foil sheet or sheets affixed thereto to form transparent and light intercepting portions.

What is claimed is:

1. An apparatus for repairing a defect in an emulsion layer of an emulsion mask, comprising: a laser oscillator for generating a laser light; an aperture means comprising an aperture for shaping the laser light upon passage of the light through it, said aperture means further comprising a plurality of blades having edges, wherein the edges overlie one another to form said aperture, the edge of at least one of said blades having a curved protrusion and the edge of at least another blade having a curved cutout, said protrusion and cutout being cooperable to define a curved contour of the aperture, said blades being adjustable in position to change the shape and size of the aperture; and means for projecting the laser light through said aperture onto the emulsion layer to form an image of the aperture on the defect so as to remove the defect.

2. The apparatus according to claim 1, wherein the curved protrusion and curved cutout are circular.

3. The apparatus according to claim 1, wherein the blades are supported for movement toward and away from each other.

4. The apparatus according to claim 1, wherein the laser oscillator is an excimer laser oscillator.

5. The apparatus according to claim 1, wherein the laser is a YAG laser.

6. The apparatus according to claim 1, further comprising a beam expander for expanding a laser beam before the laser beam is passed through the aperture means.

7. The apparatus according to claim 1, wherein said means for projecting the ultraviolet light is an image forming lens.

8. The apparatus according to claim 1, further comprising an observation lens for observing the defect, and a television camera for displaying an image of the defect passed through the observation lens on a television monitor, said lens and said camera being disposed on the side of the emulsion mask opposite to the emulsion layer in coaxial arrangement with said means for projecting the ultraviolet light onto the emulsion layer.

9. The apparatus according to claim 1, further comprising optical means for observing the image formed on the emulsion layer.

10. The apparatus according to claim 1, further comprising means for detecting the position of the aperture aligned with the defect, a hairline image generator responsive to said position detecting means to generate a hairline image corresponding to the shape of said aperture, a television camera for observing the defect on the emulsion layer to produce an image signal of the defect, and a superimposer for superimposing said hairline image and said image signal to display them together on a monitor screen.

11. The apparatus according to claim 1, further comprising means for ejecting air to blow away particles of the defect destroyed.

12. The apparatus according to claim 1, further comprising means for sucking and carrying away particles of the defect destroyed.

13. An apparatus for repairing a detect in an emulsion layer of an emulsion mask, comprising: a laser oscillator for generating a laser light; an aperture means comprising an aperture for shaping the laser light upon passage of the light through it, said aperture means further comprising a plurality of blades having edges which are in mutually overlying relationship to form said aperture, wherein at least some of the edges of the blades have a circular protrusion while the other edges of the blades are linear, the protrusion and the linear edge being cooperable to define a partly curved contour of the aperture, said blades being adjustable in position to change the shape and size of the aperture; and means for projecting the laser light through said aperture onto the emulsion layer to form an image of the aperture on the detect so as to remove the defect.

14. An apparatus for repairing a defect in an emulsion layer of an emulsion mask, comprising: a laser oscillator for generating a laser light; an aperture means comprising an aperture for shaping the laser light upon passage of the light through it, said aperture means comprising a plurality of blades having respective edges and disposed in partly overlying relationship in a region of said blade edges, the edge of one of said blades having curved protrusions and the edge of another blade having curved cutouts, each of said protrusions and each of said cutouts being cooperable to define a curved contour of the aperture, wherein said blades with the protrusions and cutouts are supported for relative movement to provide different combinations of a protrusion and a cutout so as to define different contours of the aperture; and means for projecting the laser light through said aperture onto the emulsion layer to form an image of the aperture on the detect so as to remove the defect.

15. The apparatus according to claim 14, wherein said relative movement is a relative rotary movement.

16. An apparatus for repairing a defect in an emulsion layer of an emulsion mask, comprising: a laser oscillator for generating a laser light; an aperture means comprising an aperture for shaping the laser light upon passage of the light through it, said aperture means further comprising a turnable aperture table, a first aperture blade disposed on the table which has transparent portions, a second aperture blade which has light intercepting portions and which is disposed in superposed relation to the first aperture blade, and a position adjustment means for slidingly displacing the aperture blades relative to each other; and means for projecting the ultraviolet light through said aperture onto the emulsion layer to form an image of the aperture on the defect so as to remove the defect.

17. The apparatus according to claim 16, wherein said transparent portions of the first aperture blade are rectangular and circular and wherein said light intercepting portions of the second aperture blade are rectangular and circular.

18. The apparatus according to claim 17, wherein said second aperture blade includes a rectangular transparent portion formed in a rectangular light intercepting portion.

19. The apparatus according to claim 16, wherein said transparent portions have different sizes and said light intercepting portions have different sizes.

* * * * *